(12) United States Patent
Pares

(10) Patent No.: US 8,541,304 B2
(45) Date of Patent: Sep. 24, 2013

(54) PRODUCTION OF TSV INTERCONNECTION STRUCTURES MADE UP OF AN INSULATING CONTOUR AND A CONDUCTIVE ZONE SITUATED IN THE CONTOUR AND DISCONNECTED FROM THE CONTOUR

(75) Inventor: Gabriel Pares, Bernin (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/968,125

(22) Filed: Dec. 14, 2010

(65) Prior Publication Data

US 2011/0143535 A1 Jun. 16, 2011

(30) Foreign Application Priority Data

Dec. 15, 2009 (FR) ...................................... 09 58999

(51) Int. Cl.
*H01L 21/28* (2006.01)

(52) U.S. Cl.
USPC .......................................... 438/661; 438/667

(58) Field of Classification Search
CPC ......... H01L 23/48; H01L 21/60; H01L 21/28; H01L 21/768; H01L 23/52; H01L 21/3205
USPC ................ 438/107, 410, 584, 613, 617, 620, 438/637, 639, 653, 661, 667, 928; 257/621, 257/698, 738, 751, 784, E21.158, E21.499, 257/E21.508, E21.584, E21.585, E21.586, 257/E21.597, E23.141
See application file for complete search history.

(56) References Cited

U.S. PATENT DOCUMENTS

| 6,815,827 | B2 | 11/2004 | Vieux-Rochaz et al. |
| 8,062,975 | B2 * | 11/2011 | Sanders et al. ................ 438/667 |
| 2007/0069364 | A1 | 3/2007 | Kawano et al. |
| 2008/0079131 | A1 | 4/2008 | Kim et al. |
| 2009/0032951 | A1 | 2/2009 | Andry et al. |
| 2009/0057899 | A1 | 3/2009 | Cheon et al. |
| 2009/0181494 | A1 | 7/2009 | Kim et al. |
| 2010/0224965 | A1* | 9/2010 | Kuo ............................. 257/621 |

FOREIGN PATENT DOCUMENTS

WO  WO 2004/084300 A1  9/2004

OTHER PUBLICATIONS

Preliminary Research Report dated Jul. 22, 2010 for French Patent Application No. 0958999.

* cited by examiner

*Primary Examiner* — Walter H Swanson
(74) *Attorney, Agent, or Firm* — Knobbe Martens Olson & Bear LLP

(57) ABSTRACT

A method for producing an interconnection structure is disclosed. In one aspect, there is formation in a substrate of at least one trench forming a closed contour and at least one hole situated inside the closed contour, the trench and the hole being separated by a zone of the substrate. Furthermore, the trench is filled with a dielectric material and the hole is filled with a conducting material.

22 Claims, 10 Drawing Sheets

PRIOR ART

PRIOR ART

FIG. 2C"

PRODUCTION OF TSV INTERCONNECTION STRUCTURES MADE UP OF AN INSULATING CONTOUR AND A CONDUCTIVE ZONE SITUATED IN THE CONTOUR AND DISCONNECTED FROM THE CONTOUR

CROSS REFERENCE TO RELATED APPLICATIONS

This application claims the benefit of French Patent Application No. 0958999 filed on Dec. 15, 2009, the contents of which are incorporated herein by reference in their entirety.

DESCRIPTION

1. Technical Field

The invention concerns the field of microelectronics and microsystems, and in particular that of via interconnection structures, in particular of the Through Silicon Via (TSV) type.

It provides for the implementation of an improved interconnection structure.

2. Background of the Invention

In the context of the production of stacks of microelectronic chips, it is known to make TSV (Through Silicon Via) interconnection members, i.e. connection members passing through a substrate to form a connection with one or several chips stacked on that substrate.

These connection elements, also called "vias", are traditionally made up of an internal conductive portion ensuring the passage of the current through the substrate and connecting device situated on either side of the substrate, and an insulating external portion, coating the internal conductive portion, and ensuring that the via is insulated relative to the semiconducting substrate and other surrounding vias, formed in the substrate.

The main steps for manufacturing this type of via are:
forming a hole in a substrate,
producing an insulating thickness on the walls of the hole,
filling the hole through deposition of a conductive material, for example such as doped polysilicon, tungsten, or copper.

Through via production poses problems relative to:
filling the hole due to the shape factor thereof, which is generally very high;
mechanical stresses related to the filling materials used;
insufficient insulation or overly high stray capacity depending on the dielectric insulation used and the thickness of the dielectric material of the via.

Documents WO 2004/084300 A1 and U.S. Pat. No. 6,815,827 B2 disclose methods for producing through vias formed in conducting or semi-conducting substrates by insulating part of the substrate using a trench forming a closed and insulating contour, the conduction occurring through an insulated semi-conducting region of the substrate.

Document US 2009/0181494 A1 provides for an interconnection structure in the form of a square metal stud insulated by a square contour filled with dielectric material.

Patent US 2009/0032951 A1 discloses a method for producing an annular via passing through an insulating zone formed around it.

The problem arises of finding a new method for producing via interconnection structures passing through a substrate.

BRIEF DESCRIPTION OF THE INVENTION

The present invention first concerns a method for producing an interconnection structure comprising: the formation, in a substrate, of at least a first opening, such as at least one trench, forming a closed contour and at least one second opening, for example in the form of at least one hole, situated inside said closed contour, the first opening and the second opening being separated by a zone of the substrate, the method also comprising steps for filling the first opening with a dielectric material and the second opening with a conducting material.

The present invention concerns also a method for producing an interconnection structure comprising: the formation, in a substrate, of at least a first opening, such as at least one trench, forming a closed contour and at least one second opening, for example in the form of at least one hole, situated inside said closed contour, the first opening and the second opening being separated by a zone of the substrate, the method also comprising steps for filling the first and the second openings with a dielectric material or a conducting material, the withdrawal of this material in one of the openings, the filling of this opening by the other material.

The first opening and the second opening are formed simultaneously.

Forming an insulating zone that is disconnected from the conduction zone makes it possible to achieve good quality insulation and limit the capacitive effect. This advantage can be determining when such a structure is for example produced for RF circuits.

With such a method, it is possible to easily dimension the zone between the first opening and the second opening and to form, with that zone, a guard zone for restoring contact.

According to one possible embodiment, after the formation of the first opening and the second opening:
said dielectric material can be deposited in the first and second openings;
the dielectric material is removed from the second opening,
the conducting material is formed in the second opening.

According to another possible embodiment after the first and second openings are formed, one can:
form conducting material in the first opening and the second opening,
remove the conducting material from the first opening,
deposit the dielectric material in the first opening.

The method can also comprise, between the removal of the dielectric material from the second opening and the formation of the conducting material in the second opening, a step for enlarging the second opening.

This enlargement step can be done so as to form a second, tapered opening.

Openings provided with such a shape can be filled more easily.

The conducting material can be formed in the second opening so as to cover the bottom and walls of the second opening, the method also comprising a step consisting of at least partially filling in the second opening with an insulating material.

According to one possible implementation, the step consisting of filling in the rest of the second opening with an insulating material can be done during said step for depositing said dielectric material in the first opening, said insulating material making it possible to at least partially fill in the second opening being said dielectric material.

The substrate can have a base of a conducting or semi-conducting material.

Said conducting filling material can be a given metal material, after deposition of the conducting material in the first opening and the second opening, then removal of the conducting material from the first opening, a heat treatment can be done so as to form an alloy of the given semi-conducting material and the given metal material, such as a silicide.

The second opening filled with conducting material forms a conductor member. The method can also comprise: the production of at least one connecting stud on said conductor member.

The method can also comprise a step for thinning the substrate so as to reveal an end of said conductor member.

According to one possibility, a conductor stud can be formed on said end of said conductor member.

The substrate can comprise one or several conducting zones situated on one of its faces, said formation of the hole being done by etching from the other of its faces so as to reveal at least one of said conducting zones.

The formation of the first and second openings can also comprise the formation of one or several other openings situated inside said closed contour.

The formation of the first and second openings can also comprise the formation of at least one other opening forming another closed contour surrounding said closed contour.

BRIEF DESCRIPTION OF THE DRAWINGS

The present invention will be better understood upon reading the description of embodiments, provided solely for information and non-limitingly, in reference to the appended drawings, in which.

Identical, similar or equivalent parts of the different figures bear the same numerical references so as to facilitate the transition from one figure to the next.

The different parts illustrated in the figures are not necessarily shown using a uniform scale, to make the figures more legible.

DETAILED DESCRIPTION OF THE INVENTION

Examples of TSV interconnection structures, produced using a method according to the invention, are shown in FIGS. 1A-1I.

These structures comprise at least one conductor member passing through at least part of the thickness of a substrate and at least one insulating zone making it possible to insulate the conductor member from one or several other interconnection structures and the rest of the substrate.

Figure 1A:
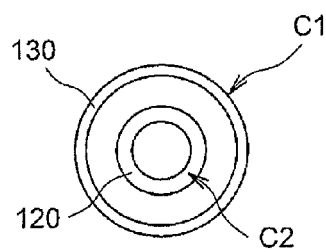
FIGS. 1A-1I illustrate different examples of interconnection structures according to the conventional art.

FIG. 1A illustrates a first example of an interconnection structure (in a top view) formed in a substrate and comprising a zone 130 with a base of a dielectric material, for example such as $SiO_2$, and forming a circular closed contour C1, as well as a conductor member 120 inside the first contour C1, the conductor member 120 being able to be metal-based, for example copper, and forming another circular contour C2.

Figure 1B:
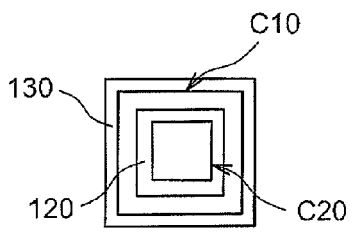

In the example of FIG. 1B, the dielectric zone 130 forms a rectangular contour C10, while the conductor member 120 also forms a rectangular contour C20 that is disconnected from and situated inside of the contour C10.

Figure 1C:
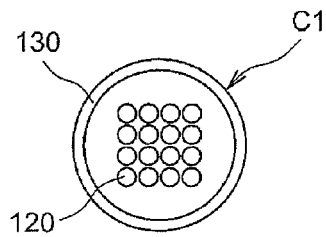

A third example of a structure is provided in FIG. 1C. In that example, the dielectric zone 130 assumes the form of a circular contour C1 inside which a plurality of distinct conductor members 120 are found.

The conductor members 120 are cylindrical in this example.

Figure 1D:
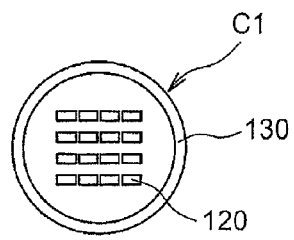

A fourth example of a structure differs from the preceding one in that the conductor members assume the shape of a rectangular rhomb (FIG. 1D).

Figure 1E:
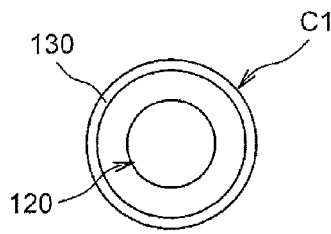

Another example of an interconnection structure comprises a dielectric material zone 130 in the form of a ring and a conductor member 120 in the form of a cylindrical stud inside said ring (FIG. 1E).

Figure 1F:
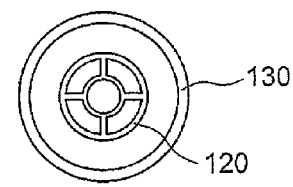

A sixth example of a structure is provided in FIG. 1F, the dielectric zone 130 being in the form of a circular contour C1, while the conductor member 120 is in the form of a plurality of conducting rings connected to each other via conducting zones joining the rings.

Figure 1G:
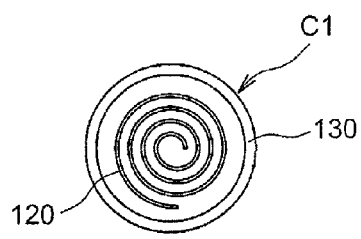

A seventh example of a structure is provided in FIG. 1G, the dielectric zone 130 being in the form of a circular contour, whereas the conductor member 120 is in the form of a spiral.

Figure 1H:
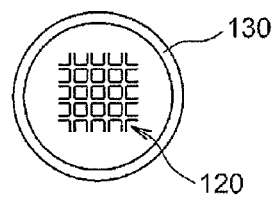

Another example of a structure is provided in FIG. 1H, the dielectric zone 130 being in the form of a circular contour, whereas the conductor member is in the form of a grate or mesh.

Figure 1I:
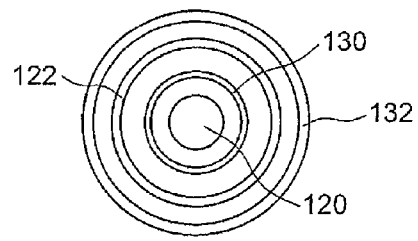

A ninth example of an interconnection structure is provided in FIG. 1I. In this example, the insulating zone 130 forms a first circular contour, whereas a conductor member 120 is situated inside the first circular contour. Another conductor member 122 forms another circular contour inside which the insulating zone 130 and the conductor member 120 are arranged.

Another dielectric zone 132 in the form of another circular contour surrounds the conductor members 120, 122 and the insulating zone 130.

In each of the examples of structures provided, an insulating zone and a conductor member surrounded by said zone pass through at least part of the thickness of the substrate and are separated from each other by at least one zone of the substrate, which can have a semi-conducting material as its base.

A first example of a method, according to the invention, for producing an interconnection structure, for example of the type previously described relative to FIG. 1A, will now be provided relative to FIGS. 2A-2F.

In this example, the starting material can be a semi-conducting substrate 100, for example Si-based, in which one or several trenches 103, 105 are formed at the same time, as well as one or several holes 102, 104, the trenches 103, 105 and the holes 102, 104 passing through at least part of the thickness e of the substrate 100.

The holes and the trenches can have a depth between 100 nanometers and 1 millimeter, for instance.

Figure 2A:
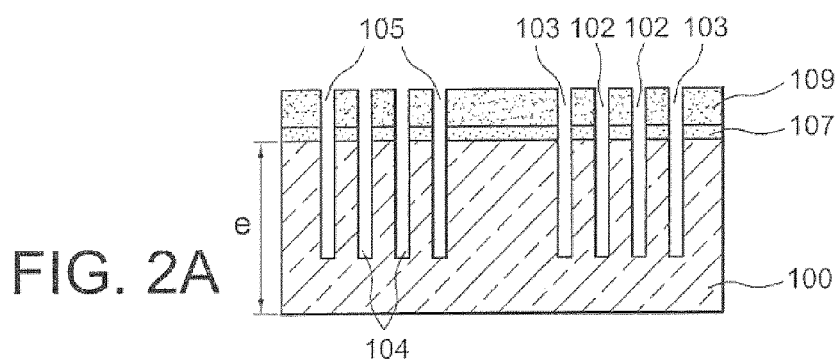
FIGS. 2A-2F illustrate a first embodiment of the production method according to the invention of a TSV interconnection structure.

To produce the trenches 103, 105 and the holes 102, 104, one can first deposit a mask layer 107, which can for example have a base of $SiO_2$ or $Si_3N_4$ and a layer of resin 109, in which openings are formed. Then, the substrate is etched through these openings (FIG. 2A).

The trenches are formed such that at least one trench 103 forms a closed contour around a substrate portion 100 and a hole 102, 104.

The holes are formed such that at least one hole 102 forms a closed contour around a substrate portion 100.

Figure 2B:
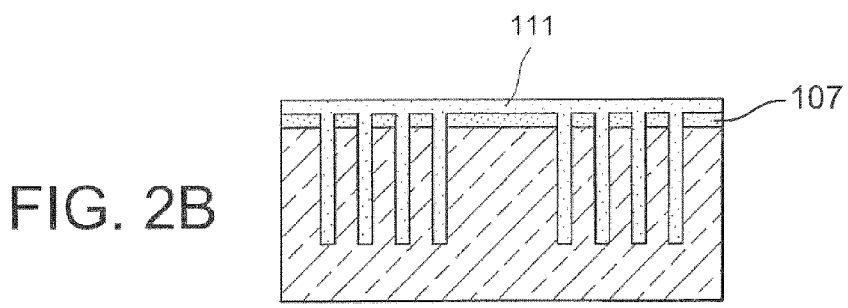

The layer of resin 109 is then removed, then the trenches 103, 105 and the holes 102, 104 are filled using a dielectric material 111, for example SiO$_2$. The filling can be done by deposition, for example of the SACVD ("Sub Atmospheric Pressure Chemical Vapor Deposition") type (FIG. 2B).

Another resin mask 113 is then formed including openings 115 situated opposite holes 102, 104. The dielectric material 111 is then removed from the hole 102, 104, for example by chemical etching using HF or by dry etching, for an oxide-type dielectric, through the openings 115 of said mask 113.

Figure 2C:
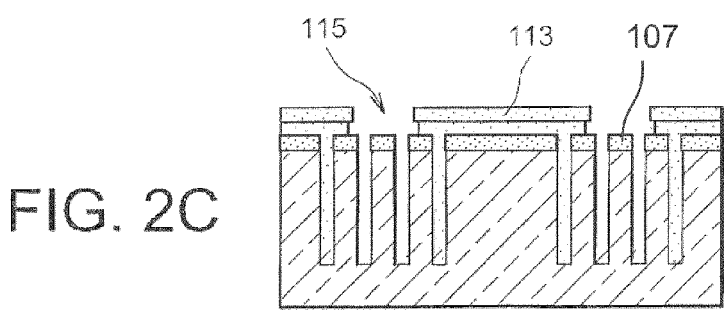
Figure 2C:
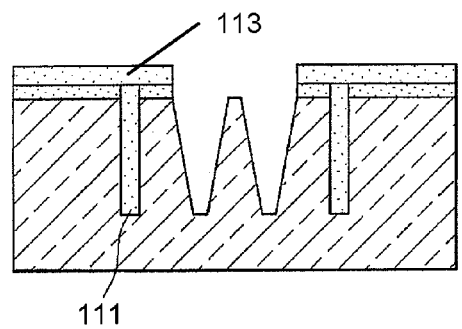
Figure 2D:
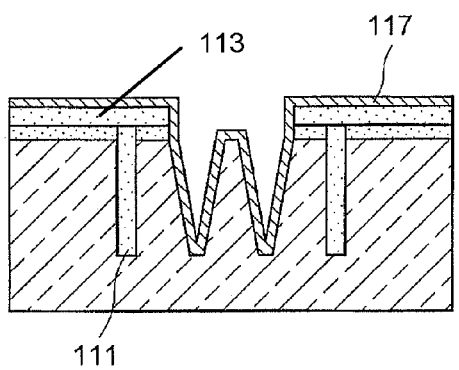
Figure 2D:
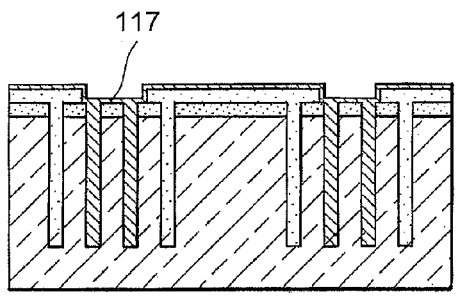

A metal material 117 is then deposited so as to fill in the holes 102, 104 (FIG. 2D).

The metal material 117 can be tungsten, for example, which can for instance be deposited by CDV ("Chemical Vapor Deposition") or copper, which can for instance be deposited by ECD (Electro-chemical deposition).

The metal material 117 extending past the mouth of the holes 102, 104 is then removed.

Figure 2E:
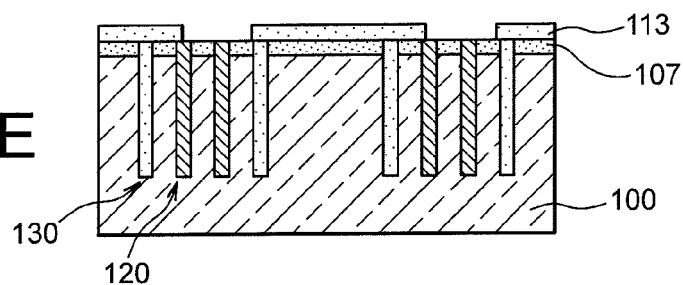
Figure 2F:
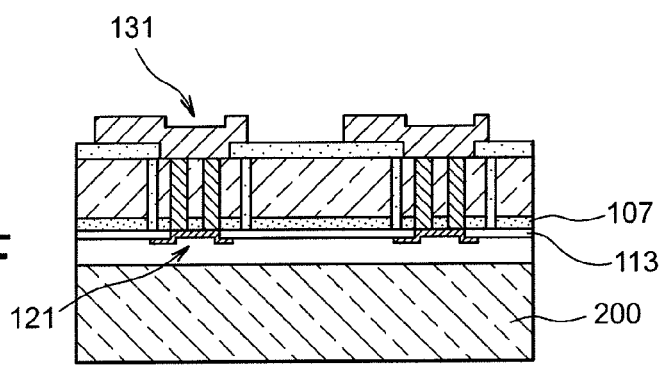

This removal can for example be done using CMP ("Chemical Mechanical Polishing"), so as to also remove the dielectric material 111 on the mask layer 107 and protruding past the mouth of the trenches 103, 105 (FIG. 2E).

Members 120 have thus been produced with a metal base, passing through part of the thickness of the substrate 100 and situated inside an insulating contour formed by a zone 130 also passing through part of the thickness of the substrate 100, the conductor members 120 being separated from the insulating zone 130 by a zone of the substrate 100.

Conducting studs 121 are then formed on the front face of the substrate, on the holes 102, 104 filled with metal material 117 so as to be in contact with the conductor members 120.

The substrate 100 can then be thinned through its back face so as to reveal the bottom of the holes 102, 104. Access is thus provided to the conductor members 120.

According to one possibility, to perform the thinning, a handle substrate 200 can be attached.

Conducting studs 131 are then formed on the back face of the substrate and in contact with the conducting members 120.

A second embodiment of a method according to the invention for producing an interconnection structure will now be provided relative to FIGS. 3A-3D.

Steps can first be carried out as in the example method previously described relative to FIGS. 2A-2D.

Figure 3A:
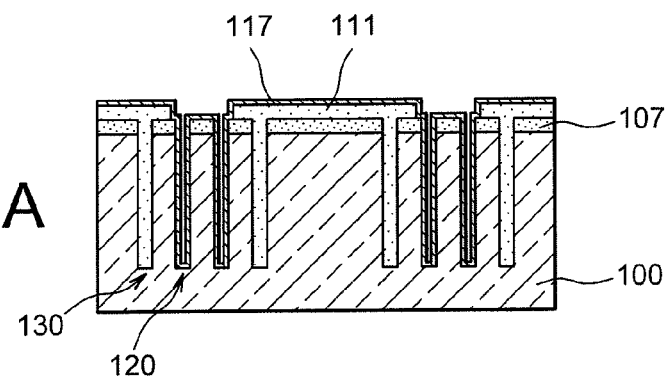
FIGS. 3A-3D illustrate a second embodiment of a production method according to the invention of a TSV interconnection structure.

The metal material 117 can then be deposited, so as to cover the bottom and the walls of the holes 102, 104 (FIG. 3A).

The deposited metal material can for example be W, or Ti, or Ni, or Pt, or Co, according to a thickness that may be between 300 and 1000 nanometers. The metal material can be deposited with a thickness provided such that the holes are not completely filled in.

A step is then carried out to form silicide zones 122 in the holes 102, 104, by performing a heat treatment, for example at a temperature in the vicinity of 400° C. to form the Ni silicide.

Figure 3B:
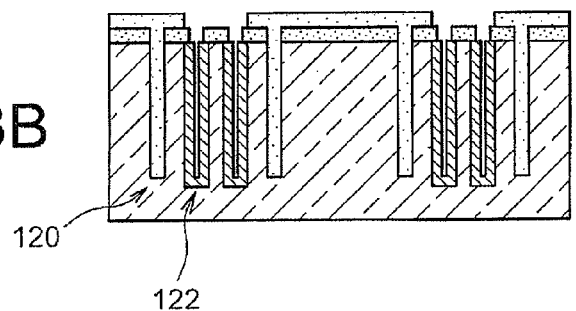

The silicide formed can for example be one of the following materials: WSi$_2$, TiSi$_2$, NiSi, PtSi, CoSi$_2$ and have a thickness for example between 1 and 3 micrometers (FIG. 3B).

Conductor members 122 have thus been formed with a base of a conducting material, passing through part of the thickness of the substrate 100 and situated inside an insulating contour formed by a zone 130 also passing through a portion of the thickness of the substrate 100, the conductor members 122 being separated from the insulating zone 130 by a semi-conducting zone of the substrate 100.

Figure 3C:
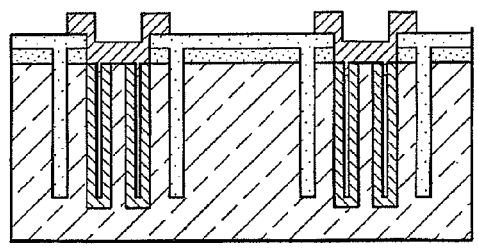
Figure 3D:
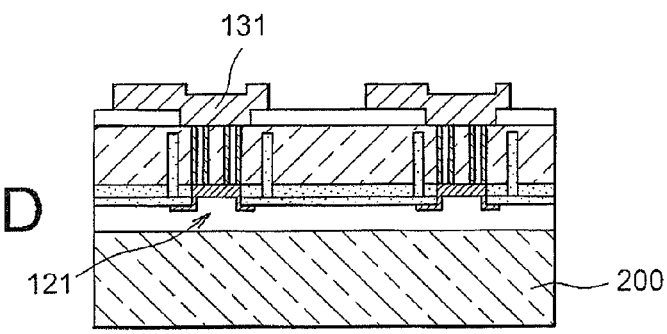

Conducting studs 121 are then formed on the semi-conducting holes 102, 104 filled with metal alloy resulting from the reaction between the metal 117 and semi-conductor material of the substrate 100, so as to be in contact with the conductor members 122 (FIG. 3C).

A thinning of the substrate 100 through its back face and so as to reveal the bottom of the holes 102, 104 can then be done. Access is thus provided to the conductor members 122.

According to one possibility, to perform the thinning, a handle substrate 200 can be attached.

Conducting studs 131 are then formed on the back face of the substrate and in contact with the conducting members 122.

According to one alternative of either of the examples of methods just provided, before filling the holes 102, 104 with a metal material 117, the holes 102, 104 can be enlarged, for example through isotropic etching thereof through the layers 107 and 111.

The etching can be done so as to form holes 102, 104 having inclined walls and a tapered shape as shown in FIG. 2C'. Such a shape of the holes 102, 104 allows easier filling thereof.

The metal material 117 is then deposited in a uniform thickness at the bottom and on the walls of the holes 102, 104 as shown in FIG. 2C".

The thickness of metal material 117 deposited can be provided such that after deposition, the central portion of the holes 102, 104 is not filled in.

Figure 4A:
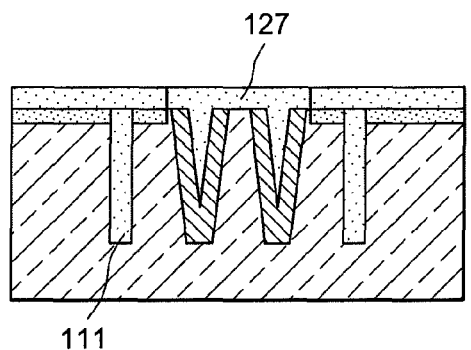
FIGS. 4A-4B illustrate another embodiment of a production method according to the invention of a TSV interconnection structure.

This portion is then filled in using a dielectric material 127 (FIG. 4A).

Figure 4B:
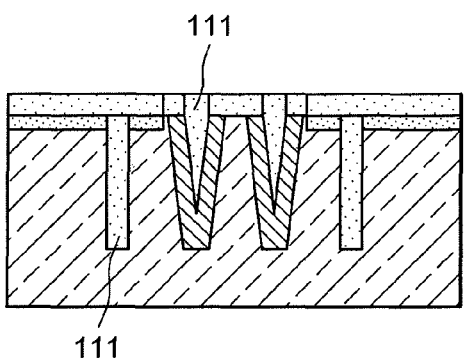

According to one possibility illustrated in FIG. 4B, the central portion of the holes can be filled in using a dielectric material 111 using which the trenches 103, 105 are filled in (FIG. 4B).

Another example of a method for producing an interconnection structure is shown in FIGS. 5A-5D.

Steps can first be performed as previously given relative to FIG. 2A.

Then, the holes 102, 104 and trenches 103, 105 can be filled in using a metal material 117.

Figure 5A:
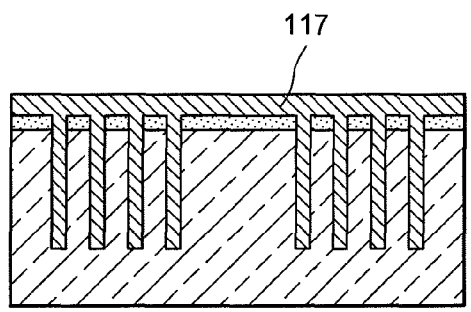
FIGS. 5A-5D illustrate a fourth example of an embodiment of a production method according to the invention of a TSV interconnection structure.

The filling may protrude past the mouth of the holes 102, 104 and trenches 103 (FIG. 5A). The metal protruding from the holes 102, 104 is removed by CMP.

Another resin mask 114 is then formed including openings 116 situated opposite trenches 103, 105.

Figure 5B:
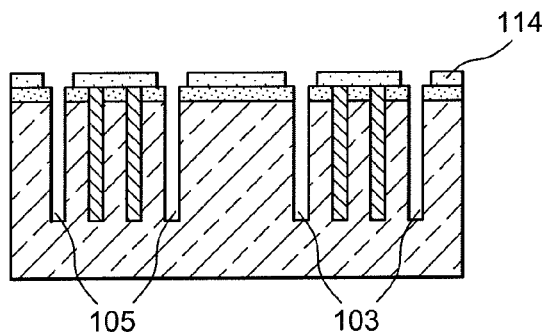

The metal material 117 is removed from the trenches 103, 105, for example by chemical etching using HF—HNO$_3$ when the metal material is tungsten through the openings 116 of said mask 114 (FIG. 5B). The mask 114 is removed using a stripping method.

Then, the trenches 103, 105 are filled in using a dielectric material 111.

Figure 5C:
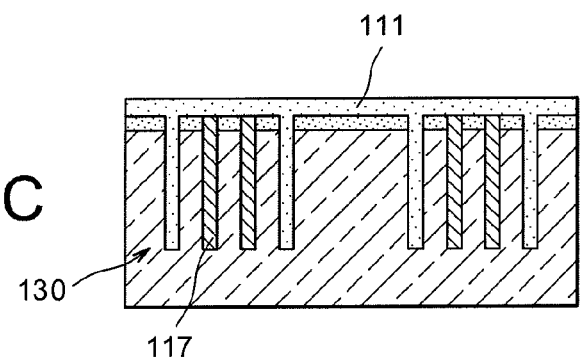

The filling can be done so as to protrude past the mouth of the holes 102, 104 and trenches 103, 105 (FIG. 5C).

Members 120 are thus formed with a base of a metal material, passing through part of the thickness of the substrate 100 and situated inside an insulating contour formed by a zone 130 also passing through part of the thickness of the substrate 100, the conductor members 117 being separated from the insulating zone 130 by a semi-conducting zone of the substrate 100.

Openings are then formed in the layer of dielectric material 111, so as to uncover the holes 102, 104.

Then, conducting studs 121 are formed on the metal-based conductor members 117.

Figure 5D:
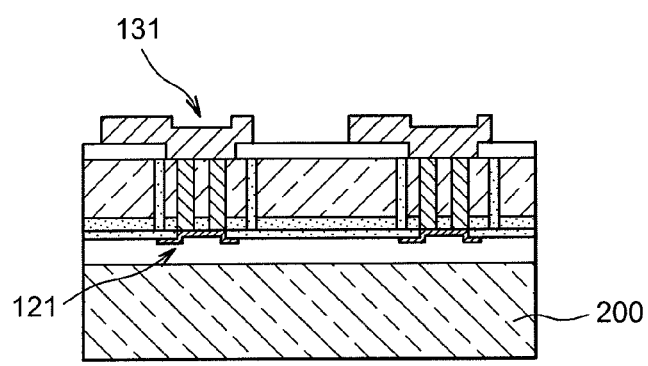

Steps for thinning the substrate 100 so as to uncover the holes 102, 104 on the back face of the substrate 100, then for forming conducting studs 131 on the back face of the substrate 100 and in contact with the conductor members 117, are then done (FIG. 5D).

A method according to the invention for producing interconnections can be implemented during "post process" steps, for example in a substrate 100, once it has been assembled with a handle substrate 200.

An example of a "post process" method for producing a TSV-type structure is illustrated in FIGS. 6A-6E.

The structure produced can for example assume a similar form to that described above relative to FIG. 1E.

In this example, the starting structure of the method is formed by a substrate 100 attached on a handle substrate 200 and possibly thinned.

One or several trenches 103, 105 are first formed, as well as one or several holes 302, 304, through a mask 109, the trenches 103, 105 and the holes 302, 304 passing through the thickness of the substrate 100.

The holes 302, 304 are formed opposite conducting studs 321, so as to uncover said studs 321.

The trenches are made such that at least one trench 103 forms a closed contour around a substrate portion and a hole 302, 304.

Figure 6A:
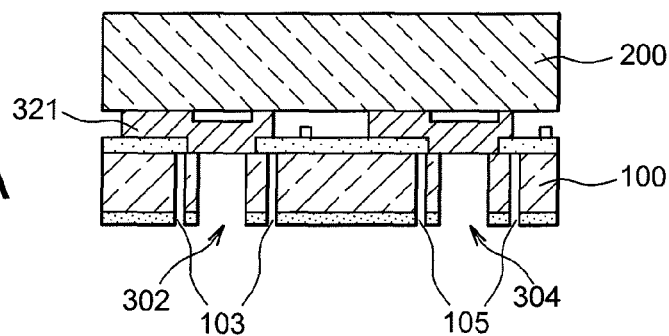
FIGS. 6A-6E illustrate a fifth embodiment according to the invention of a production method of a TSV interconnection structure.

The holes 302, 304 are surrounded by the material of the substrate 100 (FIG. 6A).

The trenches 103, 105 are then filled in using a dielectric material 111 (FIG. 5C).

Figure 6B:
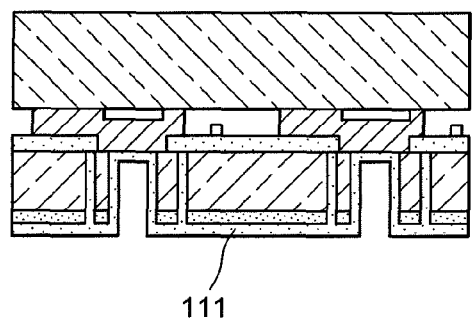

The filling can be done so as to cover the walls and bottom of the holes 302, 304, and to protrude past the mouth of the holes 102, 104 and the trenches 103, 105 (FIG. 6B).

Figure 6C:
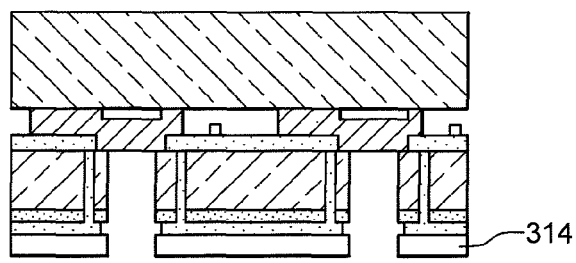
Figure 6D:
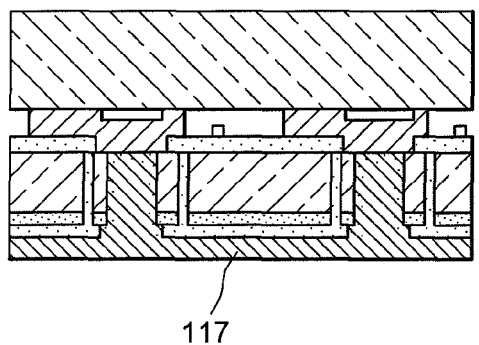

The dielectric material 111 is then removed from the holes 302, 304, for example by chemical etching using HF when the dielectric is SiO$_2$ through the openings of a resin mask 314 (FIG. 6C). Then, after having removed the resin mask 314, the holes 302, 304 are filled in using a metal material 117 (FIG. 6D).

The filling can have been done so as to protrude past the mouth of the holes 302, 304 and the trenches 103, 105. In that case, the excess metal material 117 protruding from the holes 302, 304 is removed, for example by CMP polishing.

Figure 6E:
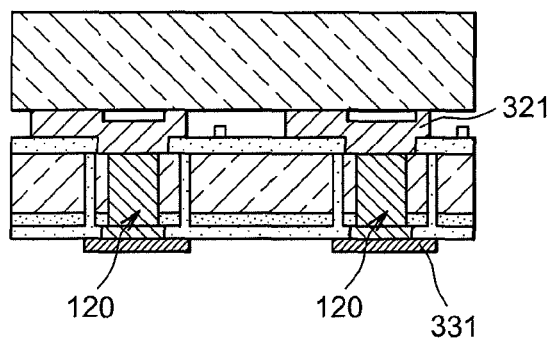

Conductor members 120 have thus been formed in contact with the connection studs 321. Then, other conducting studs 331 are formed, in contact with the conductor members 120 on the face of the substrate 100 opposite that on which the connecting studs 321 are arranged (FIG. 6E).

It will be understood that other aspects will become readily apparent to those skilled in the art from the descriptions herein. One skilled in the art would understand that the present disclosure, the drawings and the descriptions in the present disclosure are to be regarded as illustrative in nature and not as restrictive.

The description set forth in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The description includes specific details for the purpose of providing a thorough understanding of the present disclosure. However, it will be apparent to those skilled in the art that the present disclosure may be practiced without these specific details.

The description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure.

What is claimed is:

1. A method for producing an interconnection structure with at least one via passing through a substrate, the method comprising:
   simultaneously forming, in a front face of the substrate, at least one first opening producing a closed contour and at least one second opening situated inside the closed contour, wherein the second opening does not pass through the substrate and the second opening includes a wall and a bottom, the first opening and the second opening being separated by a zone of the substrate;
   filling the first and second openings with a first material;
   removing the first material from one of the first and second openings from the front face;
   forming or depositing a second material in the one of the first and second openings from which the first material is removed; and
   after forming or depositing the second material, revealing the second opening from a back face of the substrate to form one interconnection via,
   wherein each of the first material and the second material comprises one of a dielectric material and a conducting material, and wherein the first material is different from the second material.

2. The method according to claim 1, wherein the first material comprises a dielectric material and the second material comprise a conducting material, wherein the first material is removed from the second opening, and wherein the second material is formed or deposited in the second opening.

3. The method according to claim 2, wherein the conducting material is formed in the second opening so as to cover the bottom and the wall of the second opening, the method further comprising filling in the rest of the second opening with an insulating material.

4. The method according to claim 2, further comprising, between the removing of the dielectric material from the second opening and the forming or depositing the conducting material in the second opening, enlarging the second opening.

5. The method according to claim 2, wherein the substrate has a base of a given conducting or semi-conducting material and the conducting material is a metal.

6. The method according to claim 2, wherein the second opening filled with the conducting material forms a conductor member, the method further comprising producing at least one connecting stud on the conductor member.

7. The method according to claim 2, wherein the second opening is filled with the conducting material forming a conductor member, the method further comprising thinning at least one of the faces of the substrate so as to reveal one end of the conductor member.

8. The method according to claim 7, further comprising producing a conducting stud on the end of the conductor member.

9. The method according to claim 2, wherein the substrate comprises one or several conducting zones situated on one of the front and back face of the substrate, the simultaneously forming includes etching from the other of the front and back face of the substrate so as to reveal at least one of the conducting zones.

10. The method according to claim 2, the simultaneous forming comprising producing one or several other openings situated inside the closed contour.

11. The method according to claim 2, the simultaneous forming comprising producing at least one other opening forming another closed contour surrounding the closed contour.

12. The method according to claim 1, wherein the first material comprises a conducting material and the second material comprise a dielectric material, wherein the first material is removed from the first opening, and wherein the second material is formed or deposited in the first opening.

13. The method according to claim 12, wherein after depositing of the conducting material in the first opening and the second opening, and removing the conducting material from the first opening, heat treating the interconnection structure so as to form an alloy of a material of the substrate and the conducting material.

14. The method according to claim 12, wherein the conducting material is formed in the second opening so as to cover the bottom and the wall of the second opening, the method further comprising filling in the rest of the second opening with an insulating material.

15. The method according to claim 12, wherein filling in the rest of the second opening with an insulating material is performed at the same time as depositing the dielectric material in the first opening, the dielectric material filling in the rest of the second opening.

16. The method according to claim 12, wherein the substrate has a base of a given conducting or semi-conducting material and the conducting material is a metal.

17. The method according to claim 12, wherein the second opening filled with the conducting material forms a conductor member, the method further comprising producing at least one connecting stud on the conductor member.

18. The method according to claim 12, wherein the second opening is filled with the conducting material forming a conductor member, the method further comprising thinning at least one of the faces of the substrate so as to reveal one end of the conductor member.

19. The method according to claim 18, further comprising producing a conducting stud on the end of the conductor member.

20. The method according to claim 12, wherein the substrate comprises one or several conducting zones situated on one of the substrate faces, and the forming of the second opening includes etching from the other of its faces so as to reveal at least one of the conducting zones.

21. The method according to claim 12, wherein the simultaneously forming comprises producing one or several other openings situated inside the closed contour.

22. The method according to claim 12, wherein the simultaneously forming comprises producing at least one other opening forming another closed contour surrounding the closed contour.

* * * * *

UNITED STATES PATENT AND TRADEMARK OFFICE
CERTIFICATE OF CORRECTION

| | | |
|---|---|---|
| PATENT NO. | : 8,541,304 B2 | Page 1 of 1 |
| APPLICATION NO. | : 12/968125 | |
| DATED | : September 24, 2013 | |
| INVENTOR(S) | : Pares | |

It is certified that error appears in the above-identified patent and that said Letters Patent is hereby corrected as shown below:

In the Claims

In column 8 at line 61, In Claim 9, change "face" to --faces--.

In column 8 at line 63, In Claim 9, change "face" to --faces--.

In column 9 at line 20, In Claim 15, change "12, wherein filling" to --15, wherein the filling--.

In column 9 at line 21, In Claim 15, change "an" to --the--.

Signed and Sealed this
Twenty-second Day of April, 2014

Michelle K. Lee
*Deputy Director of the United States Patent and Trademark Office*